United States Patent [19]

Anderson et al.

[11] Patent Number: 5,745,425
[45] Date of Patent: Apr. 28, 1998

[54] RELIABLE BACKUP MEMORY

[75] Inventors: Dennis Lee Anderson, Naperville; Steven Anthony Jacks, Villa Park, both of Ill.

[73] Assignee: Lucent Technologies Inc., Murray Hill, N.J.

[21] Appl. No.: 703,143

[22] Filed: Aug. 29, 1996

[51] Int. Cl.⁶ .................................................. G11C 17/00
[52] U.S. Cl. ................ 365/226; 365/185.04; 365/185.09; 365/185.22; 365/201
[58] Field of Search ............................ 365/226, 201, 365/185.22, 185.04, 185.09

[56] References Cited

U.S. PATENT DOCUMENTS

| | | | |
|---|---|---|---|
| 5,267,218 | 11/1993 | Elbert | 365/185.04 |
| 5,390,148 | 2/1995 | Saito | 365/185.22 X |
| 5,444,663 | 8/1995 | Furuno et al. | 365/226 |
| 5,508,971 | 4/1996 | Cernea et al. | 365/226 X |
| 5,592,417 | 1/1997 | Mirabel | 365/185.09 X |
| 5,608,684 | 3/1997 | Reasoner et al. | 365/226 X |

*Primary Examiner*—Do Hyun Yoo

[57] ABSTRACT

An Electrically Erasable Programmable Read Only Memory (EEPROM) provides backup and initialization data for random access memory (RAM) in a control unit. In order to update the EEPROM with new releases of a program and data, the EEPROM is divided into two segments, each with a separately controllable write enable voltage. Advantageously, this allows a new release to be written into one segment of a single EEPROM without erasing the other segment until the newly written segment has been verified.

3 Claims, 4 Drawing Sheets

RELIABLE BACKUP MEMORY

RELATED APPLICATIONS

This application is related to S. A. Jacks and K. J. McNeley: "Software for Controlling a Reliable Memory" and to S. A. Jacks and K. J. McNeley: "Backup Memory for Reliable Operation," both of which applications are being filed simultaneously with this application and being assigned to the same assignee as this application.

TECHNICAL FIELD

This invention relates to arrangements for providing reliable backup memory for initializing the active memory of a processing system or control system.

PROBLEM

In fields such as telecommunications systems the demands for reliable processing of control data for controlling the establishment of connections have been made ever more severe as these systems control ever larger numbers of telecommunications terminals and facilities for interconnecting telecommunications switches. Such systems are normally controlled by programs that are stored in the memory of the processors. The memory of the processors contains not only programs but critical data describing a particular switch and other data needed by the control programs to control the operations of a switch. Such programs are normally stored in random access memory (RAM) which makes them vulnerable to errors in falsely writing data and/or errors brought about because of problems in the program. While memory protection arrangements may guard against false write operations in the critical areas of the program, such arrangements are not foolproof and provide no protection against errors during the time that a program is updated. Experience has shown that updating a program for critical data is a function which may take place as often as weekly.

Providing a backup memory such, as an electrically erasable programmable read only memory (EEPROM), to store a backup for the critical contents of the RAM is not a foolproof solution either because the updating of the EEPROM to accommodate a new program is a process which is fraught with possibilities of false operations resulting in defective backup data.

A problem of the prior art therefore is that there is no fully satisfactory arrangements for providing highly reliable backup for critical program and data stored in RAM.

SOLUTION

The above problem is solved and an advance is made over the prior art in accordance with applicants' invention wherein a backup memory is comprised of EEPROM devices which will only allow write operations to take place when a higher voltage is provided but whose contents may be read in the presence of the normal voltage; such a device is available from Intel Corporation and is commonly called a FLASH® device. In accordance with the principles of the applicants' invention, data for initializing program text and critical static text of a program is stored in such an EEPROM. During normal operation the high voltage is turned off for the EEPROM to prevent false write operations from taking place. The higher voltage is only turned on when the EEPROM is updated with new contents. Advantageously, such an arrangement provides a backup memory which is normally a read only memory and which cannot be written into except when the controllable voltage is applied under carefully controlled conditions, thus preventing false operation of the EEPROM.

In accordance with one feature of applicants' invention, the EEPROM is divided into at least two segments and the higher voltage is separately controllable for each segment. Arrangements are made to prevent two or more of the segments from having the higher voltage applied simultaneously. A hardware register controls the selection of the EEPROM devices of the segment into which a write operation can be executed. The program stored in the RAM ensures that the contents of the register are never set to permit write operation on different halves during an initialization process. In the preferred embodiment, the segments are halves. Each segment contains enough memory so that the RAM can be initialized from the contents of that segment. When the EEPROM is updated, the segment which does not contain the latest data for initializing the RAM has the higher voltage applied and is written into with the new programs and data for initializing the RAM. After these program and data have been recorded in that segment of memory and after checks have been made concerning the validity of the record, that segment becomes active and has its high voltage removed; high voltage is then applied to the other segment and that other segment has its memory cleared (reset to all 0's or all 1's). Advantageously, this arrangement provides an essentially equivalent to a duplicate storage mechanism while requiring only a single set of drivers and read and write amplifiers for the EEPROM memory.

In applicants' preferred embodiment, the RAM and EEPROM are in a common control that is duplicated. When a program update is required, one of the duplicate common controls is switched off-line and receives the updated program in its RAM. This updated program is then written from the RAM into the cleared segment of the EEPROM; then the program and data now stored in that segment of the EEPROM is used to initialize the RAM; the common control is now available for service. If trouble occurs in the other common control while this updating is taking place, the RAM is initialized from the old version stored in the EEPROM and the common control is switched back into service, to be updated later.

In applicants' preferred embodiment, an initialized EEPROM contains a program for controlling the initialization of a RAM. The program is stored as a series of functions and a series of transfer vectors for locating each of these functions. The initializing program is stored in the first part of a segment of the EEPROM. The rest of the data stored in the EEPROM includes programs, transfer vectors, static data and a check table (i.e., a table of cyclic redundancy check (CRC) words, each for checking 2 kilobytes (2K) of image). Advantageously such an arrangement minimizes the need for true non-changeable ROM, required for controlling the initiation of the initializing functions, which has the attendant problems of not being able to change such memory without changing a device.

The RAM is initially initialized at the factory with a program for controlling the writing into the EEPROM. This program is used at the factory to load the EEPROM with the program and initialization data to be used at the customer site. Thereafter the program stored in the EEPROM is used for controlling EEPROM updates; the program is first written into RAM and that RAM-stored program controls the EEPROM update.

DETAILED DESCRIPTION

Figure 1:
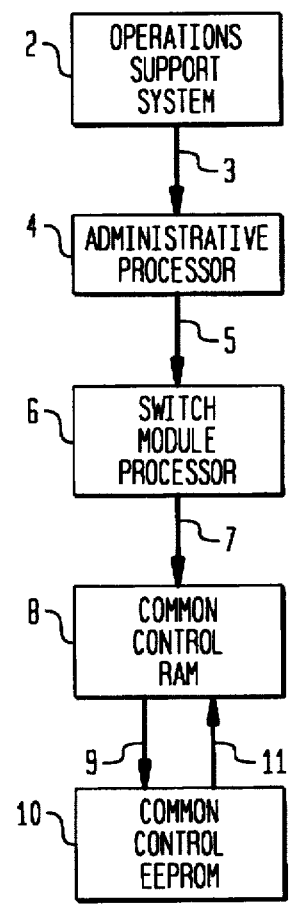
FIG. 1 is an overall diagram showing the flow of data for the exemplary embodiment of applicants' invention.

FIG. 1 is a block diagram illustrating a specific preferred embodiment of which applicants' invention is a critical part. An operations support system 2 transmits data over a link 3 to the administrative processor 4 of a switch (not shown) such as the 5ESS® switch manufactured by Lucent Technologies Inc. In this embodiment, the administrative processor forwards this new data over another link 5 to a Switch Module Processor (SMP) 6 which is within a switch module. The switch module includes a DNU (digital networking unit)/SONET interface controlled by duplicated common controls. One of the common controls has been changed to be in an off-line state in order to have its memory updated. The SMP 6 transmits the initialization data over link 7 to that common control where it is stored in RAM 8. The common control RAM data is then used to initialize the common control EEPROM 10 in a process indicated by arrow 9. The EEPROM is then used to initialize the common control RAM 8 in a process indicated by arrow 11. The processes of arrow 9 and 11 are described in detail within FIGS. 4 and 5. After this action has been completed, the off-line common control is changed to be in an on-line state and the other of the duplicated common control units is placed off-line to have its EEPROM and RAM initialized.

Figure 2:
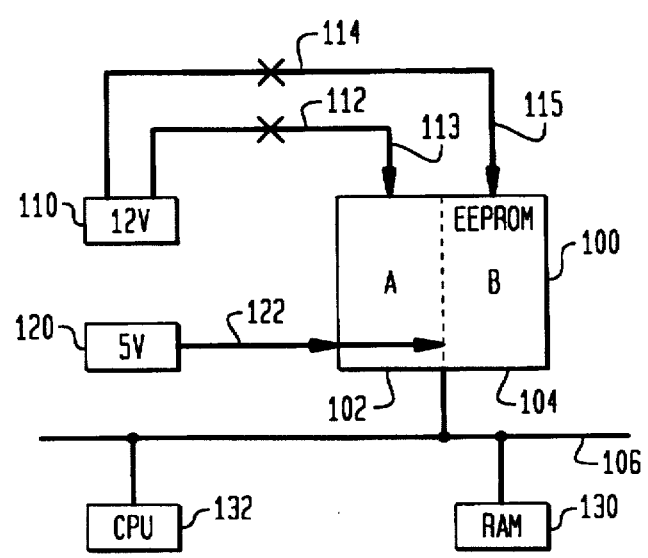
FIG. 2 is a block diagram of the hardware of applicants' embodiment.

FIG. 2 is a block diagram illustrating the relationship of the RAM, the EEPROM and a central processing unit (CPU) of the common control. An EEPROM 100, RAM 130 and CPU 132 are all connected to bus 106. CPU 132 receives instructions from the EEPROM or the RAM and controls read and write operations in both of these two memories. The EEPROM has two power supplies: a 12-volt power supply 110, and a 5-volt power supply 120. The 12-volt power supply supplies a voltage which is required for write operations in the EEPROM but is not required for read operations. The 5-volt supply is required for both kinds of operations.

The EEPROM is divided into two segments and in applicants' preferred embodiment these two segments each occupy one-half of the memory space of the EEPROM. The two segments 102 and 104 are shown in the diagram as A & B. The devices in the A segment can only be written into if the 12-volt power supply sent over lead 113 and controlled by switch 112 is active. Similarly, the devices in the B portion of the EEPROM can only be written into if the 12-volt power is applied over lead 115 controlled by switch 114. Normally, i.e. when the EEPROM is not being updated, switches 112 and 114 are both off. If one of the two halves of the EEPROM is being updated, then the corresponding switch is turned on to supply 12-volt power to the devices of the segment of the EEPROM. The 5-volt signal is always supplied over lead 122 to all the devices of the EEPROM. Since, in accordance with the principles of applicants' invention, the two sides of the EEPROM are never updated concurrently the two switches 112 and 114 are never both turned on. In applicants' preferred embodiment, the process to ensure that no more than one switch is performed in software. Clearly, many hardware arrangements are also known to those of ordinary skill in the art to ensure that the two switches are not operated simultaneously.

Figure 3:
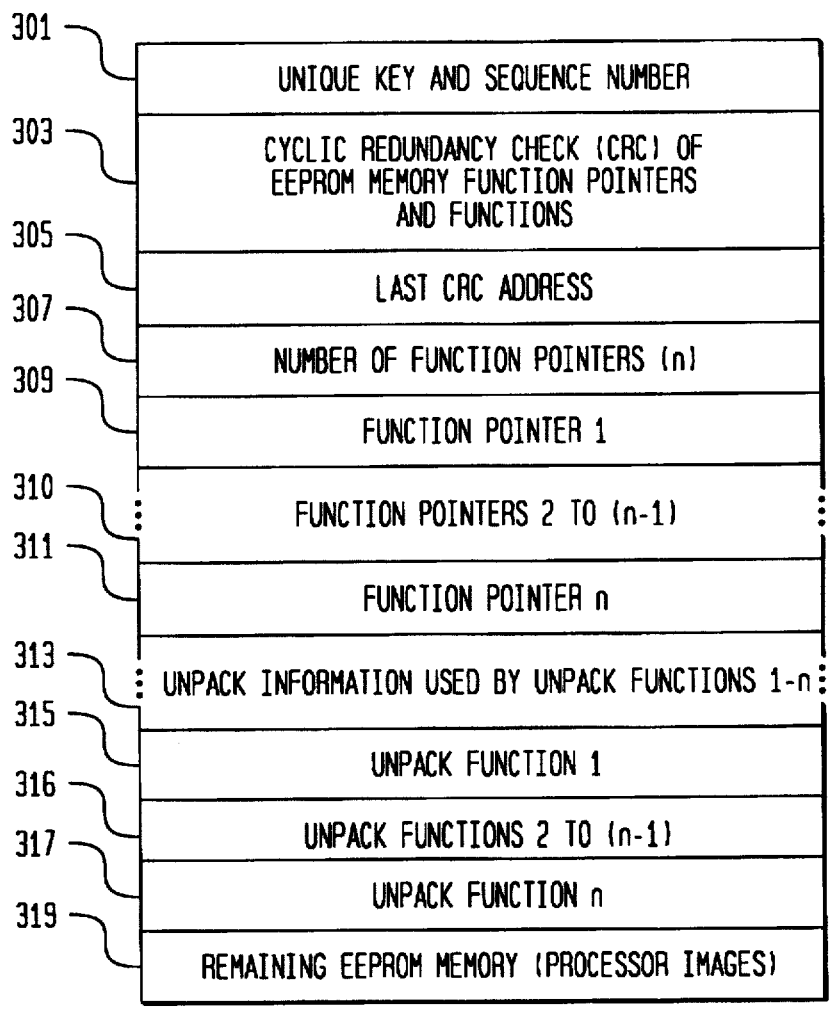
FIG. 3 is a layout of information stored in one segment of the EEPROM.

FIG. 3 illustrates the layout of the EEPROM memory. The first word 301 contains a unique key and sequence number representing, effectively, the issue number of the initialization. In case an off-line unit must be returned to active service because an on-line unit has failed, the contents of this key and sequence number are compared with the contents of the corresponding word in the other half of the EEPROM to see if the older initialization data should be used. If both halves of the EEPROM have a key plus a sequence number, this is an indication that an initialization of the newer version of the image in the EEPROM has been completed; therefore, the contents of the older EEPROM side should be ignored in favor of the contents of the newer version; the newer version is identified by the higher sequence number. The key is used to determine whether an accompanying sequence number is valid.

The next word 303 contains a cyclic redundancy check (CRC) code for that portion of the EEPROM which includes function pointers and unpack functions for controlling the initialization of the RAM. The third word 305 is the address of the last word covered by the CRC check of the second word. The fourth word 307 indicates the number of function pointers and functions stored in the first segment of the half of the memory. These four words are then followed by a series of function pointers (309, 310, 311) each of which function pointers points to one of the n unpack functions. Following the function pointers is unpack information used by unpack functions 1 to n. For example, the unpack information is used to locate the various segments of block 319. Unpack functions 1 through n are stored in blocks 315, 316, 317.

The second portion 319 of one segment (half) of the EEPROM contains text and data to be processed by the unpack functions and then stored in the RAM. The inactive RAM control programs and data support operations in the standby mode or the mode in which the RAM is being used for updating the EEPROM. This static data includes a table specifying the start and end of each of the blocks of data; this table is pointed to by a pointer in the unpack function information 313.

In applicants' preferred embodiment there are four unpack functions. The first is the performance of a CRC check over all the blocks in segment 319 of the EEPROM memory. A CRC check sum is stored for every two kilobytes (2K) of this block of memory in a sixth segment of segment 319. The second unpack function is to copy data into the RAM.

The data consists of 6 blocks. The first block is the program text for the inactive RAM control program, a program in which the common control cycles when it is not performing update functions and from which it is released upon receipt of a signal from the switching modular processor. This program is also used for controlling the updating of the EEPROM from RAM, and supports diagnostic program execution. The second block is the static data required by the inactive RAM control program. The third block comprises the transfer vectors used by the program when under RAM control in order to find the location of the program text of the various update programs executed by the common control. The fourth block comprises the program text of those programs. The fifth block comprises all static data and includes the start and end address of each 2K of the static data when it is stored in the RAM. The sixth segment stores the CRC check sum for each 2 kilobyte block of RAM memory. When the copy program has been completed, the six segments of RAM have been initialized and the holes between these segments of RAM are used to store dynamic data in the RAM. Note that the initialization data is stored within a block of 960K bytes while the RAM has 2 megabytes of memory.

The third unpack function performs a CRC check on data copied into the RAM and compares this with information stored in the EEPROM sixth block, as described above. The fourth unpack function turns control over to the RAM. All four unpack functions are called under the control of ROM; by turning over control to the RAM, the control by the ROM is terminated.

The inactive RAM control state is one wherein the common control cycles under the control of RAM and wherein the common control is either in an intermediate pump state or in the stand-by state with the other common control controlling the system.

The EEPROM also contains additional data for use in initializing the RAM for subsequent initialization of the RAM of another (subtending) processor. The unpack information is used to locate this additional data. The initialized RAM contains a program for unpacking this additional data.

Figure 4:
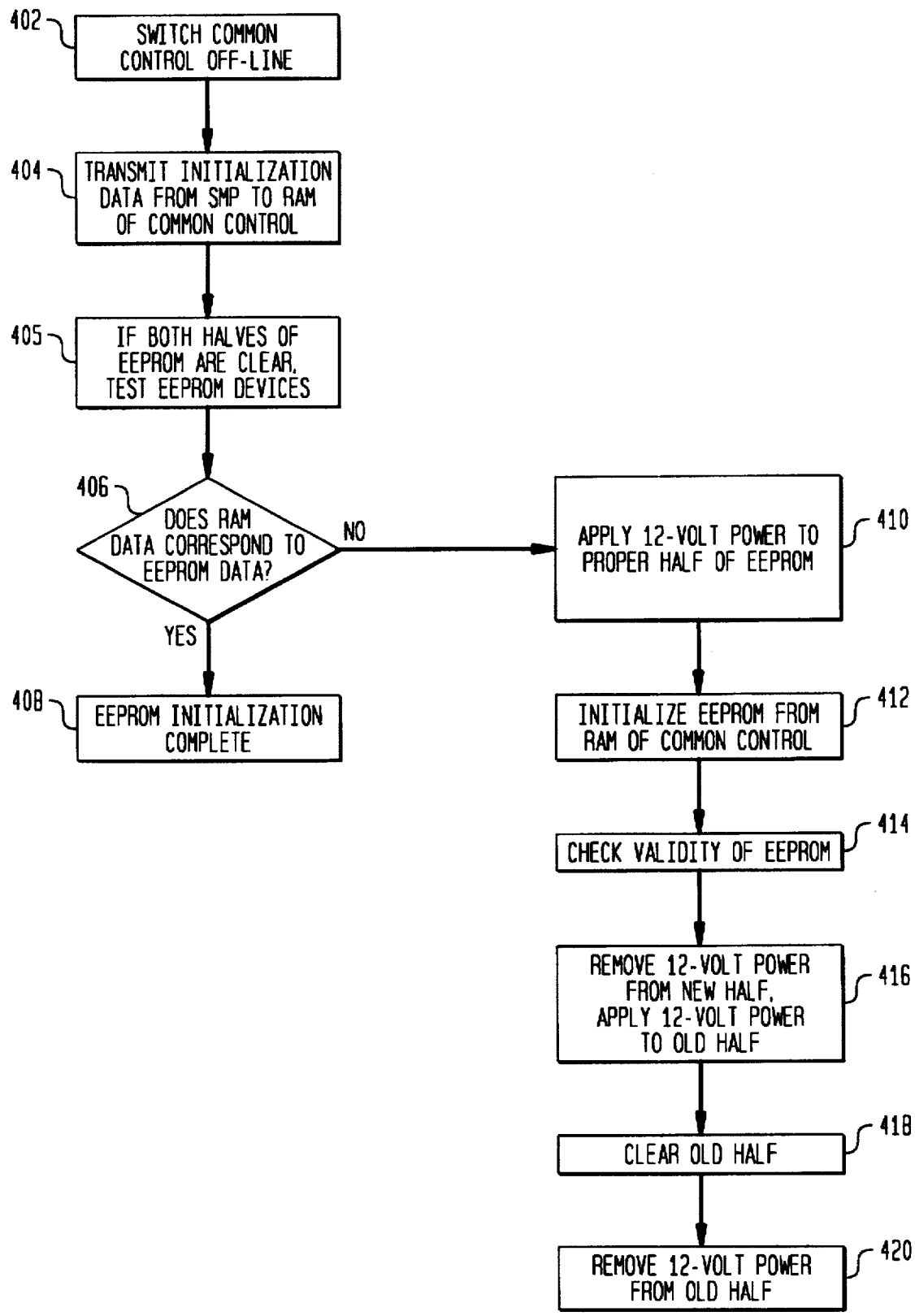
FIGS. 4 and 5 are flow diagrams of programs used to implement applicants' invention.

FIG. 4 illustrates the processes of updating one of the halves of the EEPROM. In response to a request to update such memory, one of the common controls is switched off-line (action block 402). Data for the initialization is then transmitted from the switch module processor (SMP) of the module to which the DNU/SONET interface and its common control is attached (action block 404). Action block 404 corresponds to line 7 of FIG. 1. If all parts of both halves of the EEPROM are cleared, (Test 405) the EEPROM devices are tested and the process is continued. Test 406 is then used to determine whether the contents of the RAM are equivalent to the contents of the uncleared half of the EEPROM. The test is performed by deriving data that would be written into an EEPROM for each of the locations of the EEPROM and checking whether the derived data is equal to the data already stored in the EEPROM. (The key and sequence number stored in location 301 are not used by the switch module processor as an indication of the issue number of the stored update, since any mistakes in generating such a number would lead to unnecessary EEPROM erase cycles.) If it is found that the contents of the RAM are equivalent to the contents of the EEPROM memory, then the action is complete (action block 408), and effectively it is not necessary to update the EEPROM. If the contents are not equivalent, the initialization of the cleared half of EEPROM begins. Twelve volt power is applied to the new half (i.e., the half to be initialized) of the EEPROM (action block 410) after the new half of the EEPROM has been initialized (action block 412) and checked (action block 414), the key to the issue number is written last in the new version and is cleared first in the old version; a new issue number with a valid key is an indication that the contents of the EEPROM half are valid. Thereafter, the old half of the EEPROM is cleared. First the 12-volt power is removed from the new portion of the EEPROM (action block 416) and the 12-volt power is applied to the old portion of the EEPROM (action block 416) in order to clear it (action block 418). Thereafter, the 12-volt power is removed from that portion as well (action block 420).

As noted above, if the entire EEPROM is cleared, the EEPROM devices are tested. Normally, this happens only when the devices are initially received from the device manufacturer. At that time, a test is appropriate. Following such a test, at least one segment of the EEPROM is initialized. Therefore, a program check (test 405) is made to see if the device is totally cleared, and to test the devices only if that is the case. Test 405 can be part of the operating program, even in the factory, without causing undesirable extra device test cycles to be performed; thus, even the factory will automatically test EEPROM devices only if the EEPROM is totally cleared. Since the factory test program is advantageously a working program and not a specialized program, this function is also carried out in the field. In order to prevent the field from needlessly testing the EEPROM devices, the EEPROM is shipped in the factory initialized state, which contains a working program, not in the cleared state.

Figure 5:
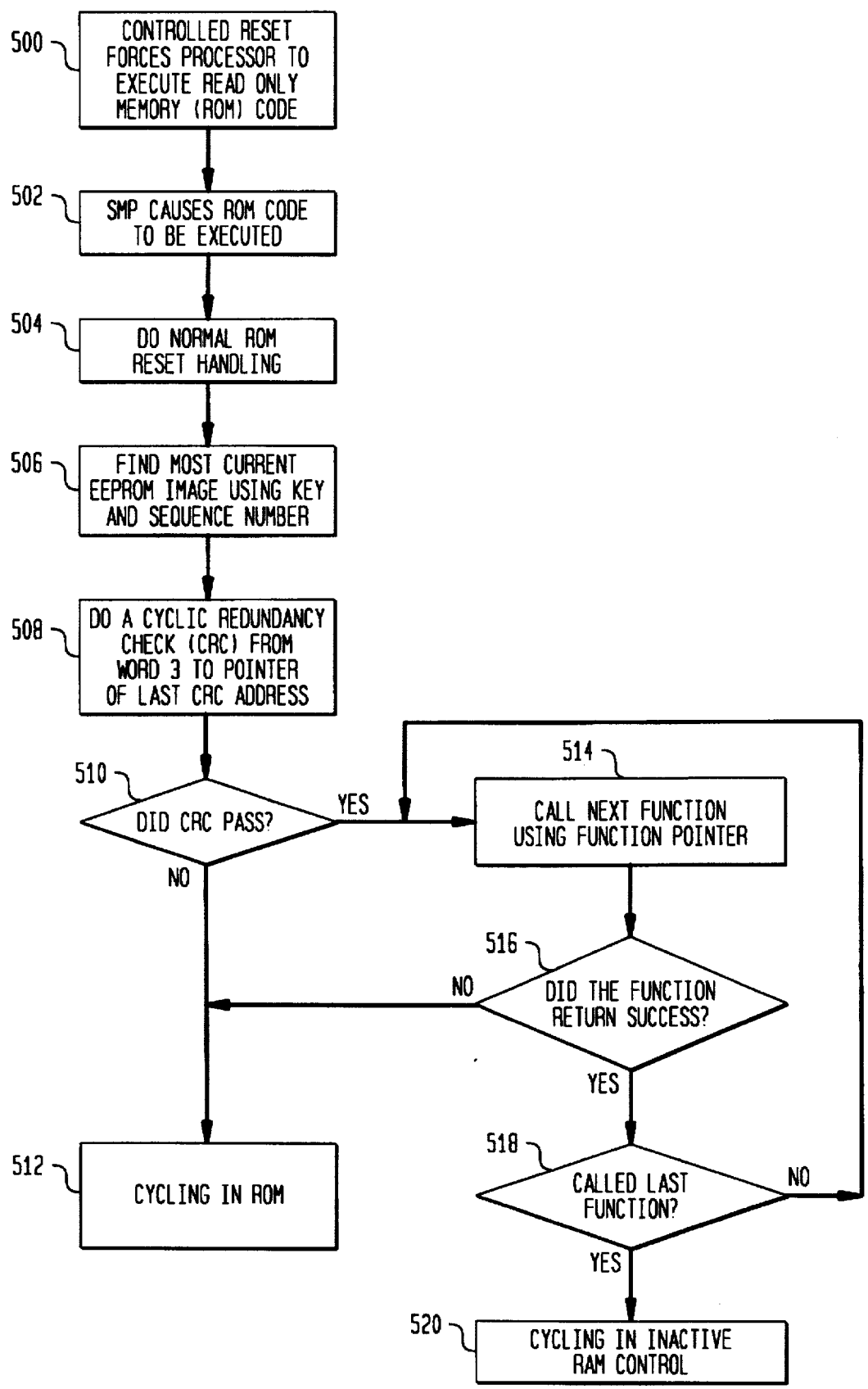

FIG. 5 illustrates the process of initializing the RAM from the EEPROM. The switch module processor sends a signal to the common control to cause the common control to be reset (action block 502) which causes the common control to execute code stored in ROM (action block 504). Action block 506 is used to determine which half of the EEPROM is to be used for initializing. This is done by examining the first word, i.e., the word that contains the unique key and sequence number of each half of the EEPROM in order to determine whether either of these words is zero (indicating cleared memory), or, if neither is zero, which sequence number and key represents the latest update. Since, following a successful update of one of the halves of the EEPROM, the other half is cleared, such a situation can only happen if the request to initialize RAM is received while an EEPROM half was being updated and the last step of the update had not been completed. Therefore, the half identified by the later (higher) sequence number accompanied by a valid key is the half that should be used for initializing the RAM.

Action block 508 indicates that a cyclic redundancy check is performed from the third word of the selected half of the EEPROM to the last CRC address (305) indicated by that third word. Test 510 is used to determine whether that CRC passed. If not, an indication that the common control is not available to become active, then the common control will continue cycling under the control of the ROM (action block 512). If the CRC passed, then the loop indicated by blocks 514, 516, and 518 is repeatedly executed. This loop consists of the ROM controlled program calling for the execution under EEPROM control of the next function using the function pointer stored in the EEPROM. (The first time block 514 is invoked, this will be the first function.) Test 516 determines if the function was executed successfully; if not, action block 512 previously described is executed. If the function was successfully executed, then test 518 determines if this is the last function. If this is the last function, action block 520 (standby cycling under RAM control) is executed. The common control sends a signal to the switch module processor when it enters state 520, and a different signal when it enters state 512, so that the switch module processor knows whether the common control is available or not.

In an alternative arrangement, for a different type of EEPROM, write protection can be substituted for removal of the 12-volt power. The same steps are executed with only that change.

Many similar arrangements can be designed without departing from the scope of this invention. The invention is therefore limited only by the claims.

We claim:

1. A method of providing reliable backup memory from an electrically erasable programmable read only memory (EEPROM), having a higher voltage power supply that must be connected to the EEPROM in order to change its contents, comprising the steps of:

removing said higher voltage power supply when the EEPROM is not being updated;

applying said higher voltage power supply only when said EEPROM is being updated;

splitting said EEPROM into at least two segments, each segment being fed by a separately controllable source of said higher voltage; and updating one of said segments while retaining a previous version of the information stored in said EEPROM in the other segment while supplying the higher voltage only to the one segment being updated.

2. The method of claim 1 further comprising the steps of:

following a successful updating of the one segment of said EEPROM, removing the higher voltage from the successfully updated segment;

applying the higher voltage to the other segment; and clearing the other segment.

3. A method of providing reliable backup memory from an electrically erasable programmable read only memory (EEPROM), having a higher voltage power supply that must be connected to the EEPROM in order to change its contents, comprising the steps of:

removing said higher voltage power supply when the EEPROM is not being updated;

applying said higher voltage power supply only when said EEPROM is being updated;

initially receiving said EEPROM with all devices cleared prior to putting said EEPROM into service;

testing whether said EEPROM is cleared;

if said EEPROM is not cleared, avoiding testing devices of said EEPROM;

whereby excessive tests of devices of said EEPROM are avoided.

* * * * *